United States Patent [19]
Yasuzato et al.

[11] Patent Number: 5,935,738
[45] Date of Patent: Aug. 10, 1999

[54] PHASE-SHIFTING MASK, EXPOSURE METHOD AND METHOD FOR MEASURING AMOUNT OF SPHERICAL ABERRATION

[75] Inventors: Tadao Yasuzato; Shinji Ishida, both of Tokyo, Japan

[73] Assignee: NEC Corporation, Tokyo, Japan

[21] Appl. No.: 09/025,687

[22] Filed: Feb. 18, 1998

[30] Foreign Application Priority Data

Feb. 20, 1997 [JP] Japan .................................. 9-036190

[51] Int. Cl.⁶ ...................................................... G03F 9/00
[52] U.S. Cl. ................................................................ 430/5
[58] Field of Search .................................. 430/5, 22, 322; 355/53, 71

[56] References Cited

U.S. PATENT DOCUMENTS 5,710,620  1/1998  Taniguchi ..................................... 430/5

FOREIGN PATENT DOCUMENTS

| 57-62052 | 4/1982 | Japan . |
| 62-67514 | 3/1987 | Japan . |
| 2166719 | 6/1990 | Japan . |
| 2256985 | 10/1990 | Japan . |
| 697040 | 4/1994 | Japan . |
| 811409 | 5/1996 | Japan . |

OTHER PUBLICATIONS

Effect of Lens Aberration on Hole Pattern Fabrication Using Halftone Phase–Shifting Masks; Akihiro Otaka et al.; Digest of Papers Photomask Japan 1997.

*Primary Examiner*—S. Rosasco

[57] ABSTRACT

To a projection lens system is added spherical aberration of $0.1\lambda$, and the exposure is performed by using a phase-shifting mask having a phase difference of 200 degrees which is provided with a phase error of 20 degrees corresponding to the spherical aberration amount. Therefore, the focus characteristic can be more remarkably flattened as compared with the prior art in which the phase difference of the mask is set to 180 degrees and the spherical aberration of the projection lens system is set to zero, so that the depth of focus can be enlarged by about 0.2 micron and the precision of the pattern dimension of semiconductor devices manufactured by using the exposure method can be enhanced.

7 Claims, 17 Drawing Sheets

PHASE DIFFERENCE = 160 DEGREES
FOCUS CHARACTERISTIC OF 0.35-micron HOLE
— △ —  SPHERICAL ABERRATION = 0
— ○ —  SPHERICAL ABERRATION = 0.025λ
—•—  SPHERICAL ABERRATION = 0.05λ
---•---  SPHERICAL ABERRATION = 0.075λ
— • —  SPHERICAL ABERRATION = 0.1λ
— ■ —  SPHERICAL ABERRATION = -0.025λ
—■—  SPHERICAL ABERRATION = -0.05λ
---■---  SPHERICAL ABERRATION = -0.075λ
— □ —  SPHERICAL ABERRATION = -0.1λ

AMPLITUDE DISTRIBUTION OF TRANSMITTED LIGHT

FOCUS CHARACTERISTIC OF 0.35-micron HOLE

---△--- PHASE DIFFERENCE 180 DEGREES/ SPHERICAL ABERRATION 0

—○— PHASE DIFFERENCE 200 DEGREES/ SPHERICAL ABERRATION 0

---□--- PHASE DIFFERENCE 180 DEGREES/ SPHERICAL ABERRATION 0.1λ

—●— PHASE DIFFERENCE 200 DEGREES/ SPHERICAL ABERRATION 0.1λ

VARIATION OF FOCUS CHARACTERISTIC DUE TO SPHERICAL ABERRATION

VARIATION OF FOCUS CHARACTERISTIC DUE TO PHASE ERROR

—·—+—·— PHASE DIFFERENCE = 160 DEGREES

——×—— PHASE DIFFERENCE = 170 DEGREES

——●—— PHASE DIFFERENCE = 180 DEGREES

---△--- PHASE DIFFERENCE = 190 DEGREES

——□—— PHASE DIFFERENCE = 200 DEGREES

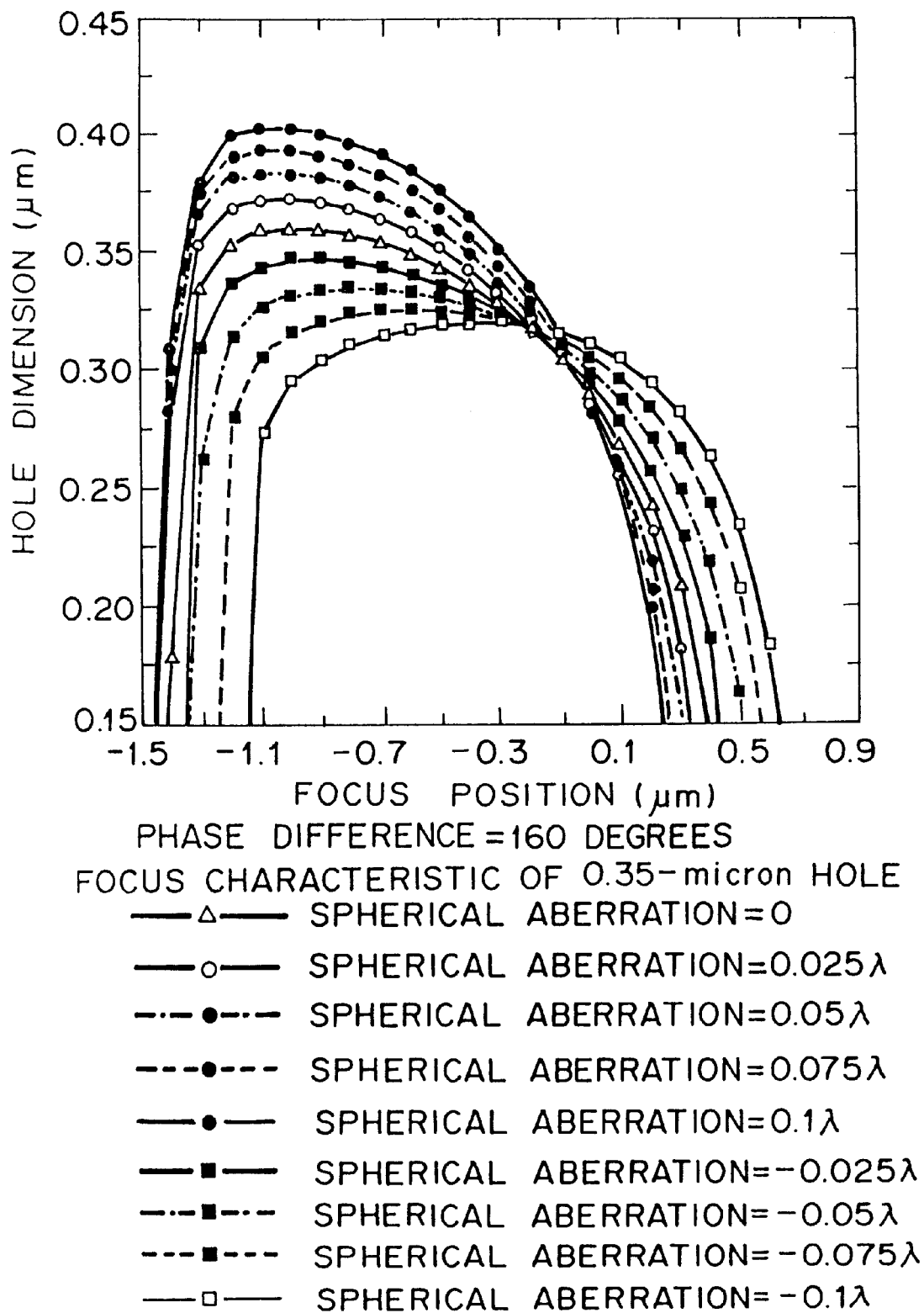

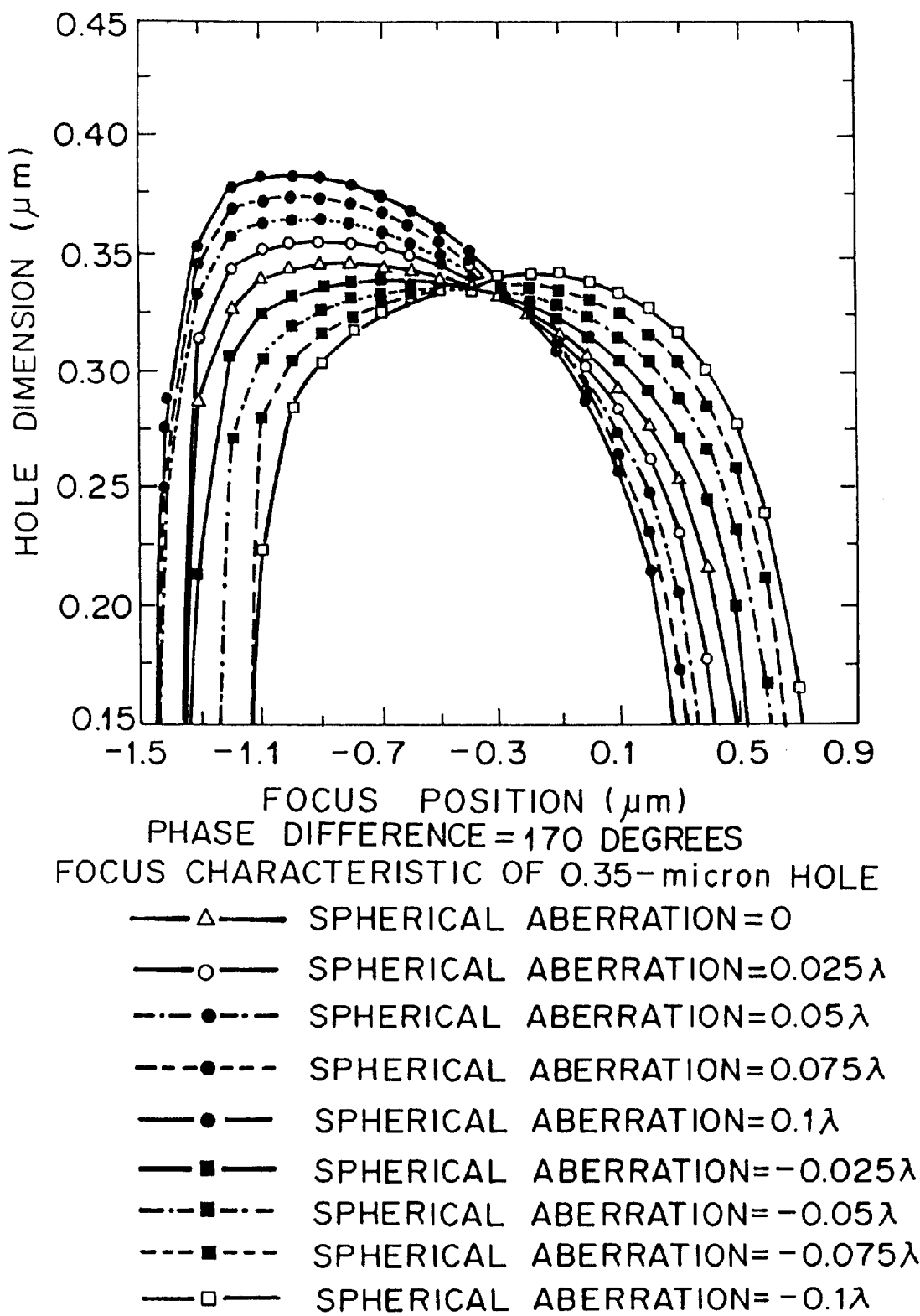

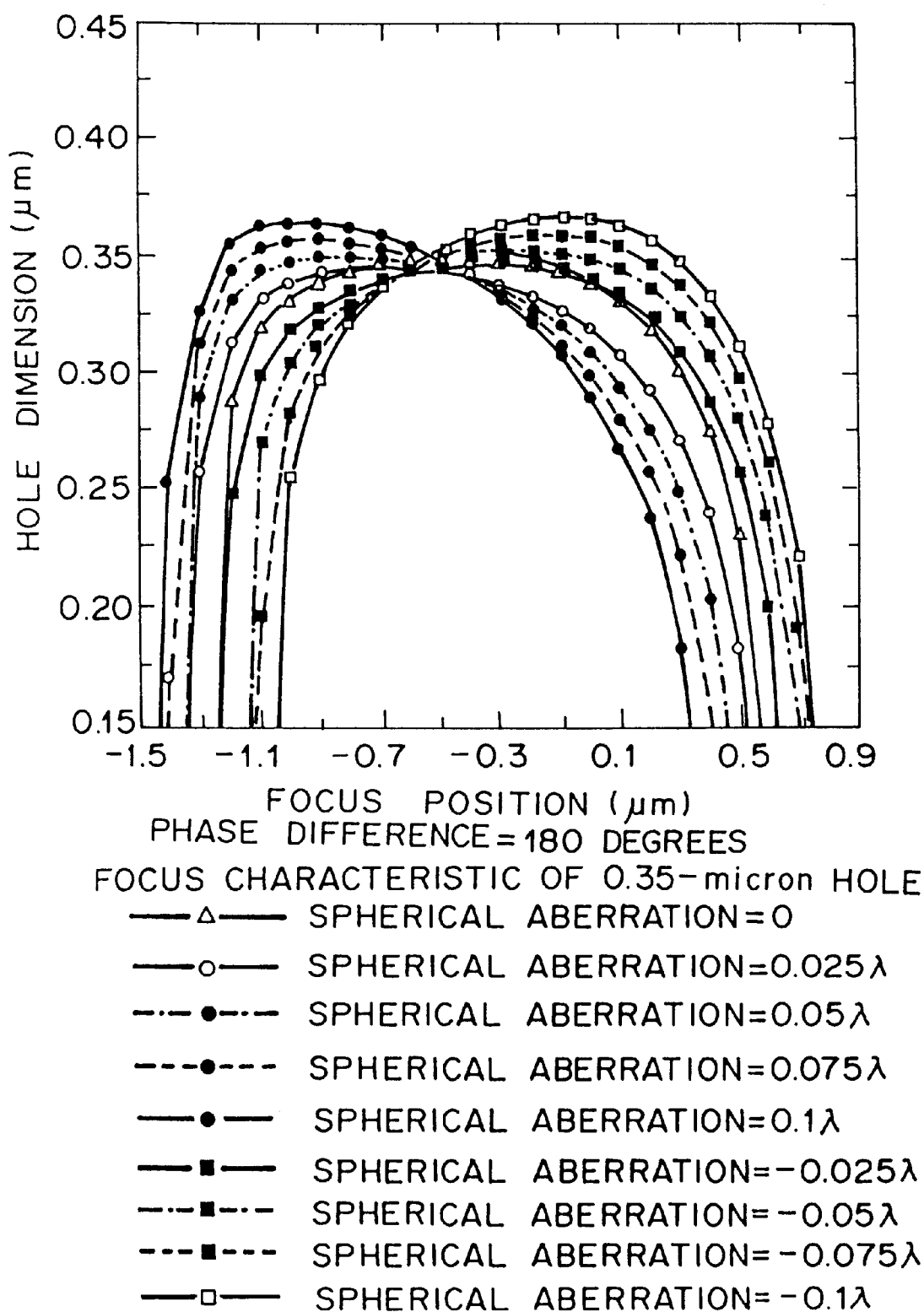

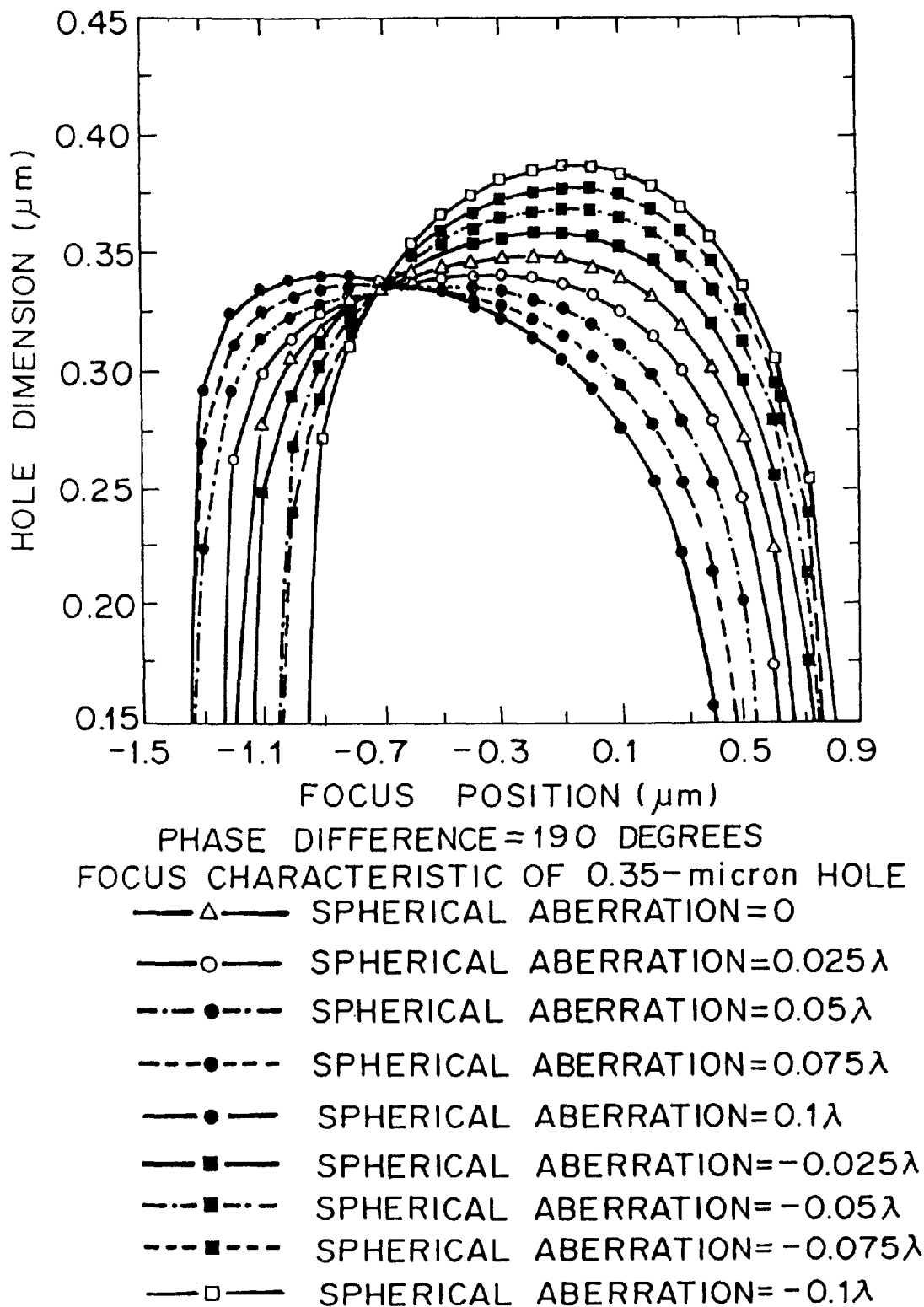

FOCUS CHARACTERISTIC OF 0.35-micron HOLE PATTERN

FOCUS CHARACTERISTIC OF 0.35-micron HOLE

RELATIONSHIP BETWEEN SLOPE OF FOCUS
CHARACTERISTIC AND SPHERICAL ABERRATION

FOCUS CHARACTERISTIC OF 0.35-micron HOLE

— △ — SPHERICAL ABERRATION = 0

— · ● — · — SPHERICAL ABERRATION = 0.05λ

— ● — SPHERICAL ABERRATION = 0.1λ

— · ■ — · — SPHERICAL ABERRATION = -0.05λ

— ■ — SPHERICAL ABERRATION = -0.1λ

PHASE-SHIFTING MASK, EXPOSURE METHOD AND METHOD FOR MEASURING AMOUNT OF SPHERICAL ABERRATION

BACKGROUND OF THE INVENTION

1. Field of the Invention

The present invention relates to an exposure method in an optical lithography process used in a semiconductor device manufacturing process, a phase-shifting mask used in an exposure system, and a method of manufacturing the amount of spherical aberration of a projection lens system in an exposure system.

2. Description of the Related Art

At present, an optical lithography technique has been used to form a pattern on a semiconductor substrate in a semiconductor device manufacturing process. In the optical lithography technique, a pattern of a photomask (which is a master plate for exposure on which a pattern containing a transparent area and a light shielding area is formed. It is called as "reticle" particularly when the reduction ratio is not 1:1, however, in the following description it is referred to as "photomask" or merely "mask" in any case) is transferred onto a semiconductor substrate coated with photosensitive resin by a reducing projection exposure system, and then developed to form a predetermined pattern of photosensitive resin.

The optical lithography techniques until now have been mainly advanced to develop exposure systems, and particularly to increase NA (numerical aperture) of the projection lens system and thus enhance the minuteness of the semiconductor device pattern. Here, NA represents the numerical value which represents the degree of spreading of light which can be converged by the lens. As the numerical value is larger, more spreading light can be converged and the lens performance is higher.

Further, as generally well known as Rayleigh equation, the resolution limit R (the limit dimension of a fine pattern which can be resolved) and NA has the following relationship: $R = K_1 \times \lambda / NA$ (here, $K_1$ is a constant dependent on the process such as performance of photosensitive resin or the like), and the resolution limit is more minute as NA is increased.

However, although the resolution is enhanced by increasing NA of the exposure system, the depth of focus (the range in which the deviation from the focus position is permissible) is reduced, and thus it is difficult to achieve a more minute design from the point of the depth of focus. As a physical description is omitted, it is also well known that the depth of focus DOF and NA have the following relationship: $DOF = K_2 \times \lambda / NA^2$ (here $K_2$ represents a constant dependent on the process) as Rayleigh equation as like the foregoing case. That is, as NA is increased, the depth of focus is narrower, and thus no permission is given even to a slight deviation from the focus position.

Therefore, considerations on the spherical aberration have been made to enlarge the depth of focus. The effect of the considerations of the spherical aberration is described in detail in Japanese Laid-open Patent Application No. Hei-2-166719. When the spherical aberration is subjected to excessive correction, the contrast in the best focus state is reduced, however, the deterioration due to defocus is suppressed, so that the depth of focus can be enlarged. Further, it is known that the spherical aberration can be varied by varying the optical path between a mask and a projection lens system. As one of specific methods, Japanese Laid-open Patent Application No. Hei-2-166719 discloses a method of designing a projection lens to have a telecentric structure even at a mask side and inserting a transparent plane-parallel plate between the mask and the projection lens system. If the plane-parallel plate is inserted into a portion where light is made telecentric, only the spherical aberration can be varied without effecting the other aberrations. Further, as a conventionally well known method has been used a method of varying the spherical aberration by moving the mask to be close to or far away from the projection lens. Still further, Japanese Laid-open Patent Application No. Hei-6-97040 discloses that the sign of the spherical aberration to be applied is selected in accordance with the positive or negative type of photosensitive resin.

The spherical aberration is not altered while it is used on a semiconductor device manufacturing line except for an exposure system having a spherical aberration correcting mechanism, and the amount of the alteration is not measured. Aberration such as distortion, curvature of field or coma is periodically measured, and managed so that the value thereof is below a predetermined value. However, the spherical aberration is little effective, and thus it is considered unnecessary to manage spherical aberration. In addition, there is no method of measuring the spherical aberration of the projection lens which is installed in an exposure system. Therefore, no variation has been made on the amount of the spherical aberration of the installed projection lens. In general, the spherical aberration of the projection lens is adjusted before the projection lens is installed into the exposure system and, thereafter the projection lens is used without any adjustment as is installed into the exposure system. On the other hand, in the exposure system having the spherical aberration correcting mechanism, the spherical aberration amount to be added due to the variation amount of the optical path between the mask and the projection lens when an aberration varying mechanism is moved is calculated.

Separately from the above-mentioned enlargement of the depth of focus by the spherical aberration, various super-resolution methods have been considered. In general, the super-resolution method is a method of improving the light intensity distribution on an image plane by controlling the transmittance and the phase in an illumination optical system, a photomask and the pupil plane of the projection lens system.

A phase-shifting mask which is used in performing a super-resolution method based on the improvement at the photomask side will be described hereunder.

The phase-shifting mask is used to control the phase of light passing through the mask to improve the light intensity distribution on the image plane.

There are various types for the phase-shifting mask. First, the phase-shifting mask of Shibuya-Levenson type disclosed in Japanese Laid-open Patent Application No. Sho-57-62052 will be described. This type is a system of alternately changing the phase of light passing through a transparent area in a periodical pattern by 180 degrees.

FIGS. 1A and 1B are plan view and longitudinally-sectional view which show a Shibuya-Levenson type phase-shifting mask. A light-shielding film 102 is formed on a transparent substrate 101, and the light-shielding film 102 is selectively removed to form a space pattern 11 (openings) periodically. A transparent film 104 is disposed in every other space pattern. The wavelength $\lambda$ of light is represented by $\lambda/n$ in a medium in which the light is propagated (n represents refractive index of the medium), and thus a phase difference occurs between light passing through air (n=1) and light passing through the transparent film 104. The phase difference is set to 180 degrees by setting the film thickness t of the transparent film 104 to $t=\lambda/2(n_1-1)$ (here, $\lambda$ represents the wavelength of exposing light and $n_1$ represents the refractive index of the transparent film 104).

Therefore, as shown in FIG. 1C, the amplitude distribution of the transmission light through the Shibuya-Levenson type mask has such a distribution that the phase is alternately inverted, and this amplitude distribution has a period which is twice of that of the original distribution. Therefore, the diffraction angle of the diffracted light from the mask is set to a half of the usual one. The light diffracted by the mask having a pattern which is so fine as below the resolution limit of the prior art can also be collected through the projection lens. Due to the interference between light beams which are inverted in phase, the light intensity is reduced between adjacent opening portions, whereby a fine pattern can be separated. The transparent film 104 is called as a phase shifter, and it is usually formed of silicon oxide ($SiO_2$).

As another type of the phase-shifting mask has been known an auxiliary pattern type which is applicable to an isolated pattern as disclosed in Japanese Laid-open Patent Application No. Sho-62-67514. In this mask, a fine pattern which is not resolved is provided around an original pattern (hereinafter referred to as "main pattern"). The phase of light is inverted between the main pattern portion and the auxiliary pattern portion to give the effect of the phase shift.

FIGS. 2A is a plan view showing an auxiliary pattern type phase-shifting mask, and FIG. 2B is a longitudinally-sectional view showing the auxiliary pattern type phase-shifting mask shown in FIG. 2A. As shown in FIGS. 2A and 2B, a space pattern 11 which is an original pattern to be transferred and an auxiliary pattern 12 which is a fine pattern below the resolution limit of the exposure device are formed on a light-shielding film 102 on a transparent substrate 101. Further, a transparent film 104 is formed on the auxiliary pattern 12, whereby a phase difference of 180 degrees is provided between light passing through the space pattern 11 and the light passing through the auxiliary pattern 12.

Still further, a halftone type of phase-shifting mask disclosed in Japanese Laid-open Patent Application No. Hei-2-256985, to which much attention is paid at present, is known as being simple in the mask design and manufacturing process. The considerations on the halftone type have been mainly advanced for hole patterns. It is also shown that the combination with the halftone type and a modified illumination method also gives an effect on a general line type pattern.

FIGS. 3A and 3B show a halftone type phase-shifting mask. As shown in FIGS. 3A and 3B, a semi-transparent film 103 is provided in place of the light-shielding film of the usual mask so that a phase difference of 180 degrees occurs between light passing through the semi-transparent film 103 and light passing through the transparent area around the semi-transparent film 103. The semi-transparent film is formed of chromium oxide nitride, molybdenum silicide oxide nitride, chromium fluoride or the like, and the transmittance thereof is generally set to the range from 4% to 20%.

The Shibuya-Levenson type and the halftone type were first applied to the X-ray exposure field. In the X-ray exposure is used a mask which has a pattern formed with heavy metal such as gold, tungsten or the like on a thin film such as SiC, diamond or the like which is called as "membrane". SiC or the like has little absorption of X-rays, and most of X-rays is shielded by the portion on which the heavy metal pattern is formed, and thus the pattern can be transferred. However, heavy metal must be formed at a relatively large thickness in order to perfectly shield the X-rays, and the increase in film thickness makes the processing thereof difficult. Therefore, light is somewhat transmitted through the mask. However, it has been also found that the contrast is more enhanced than the case where the light is perfectly shielded if the phase difference is equal to 180 degrees even when light is somewhat transmitted. This was the first proposal of the halftone phase-shifting mask.

With respect to the X-ray exposure, there have been considered a proximate exposure system for performing a transfer process at equi-magnification while a semiconductor substrate and a mask are brought into close contact with each other at a distance of several microns, and a reductive exposure system for performing a transfer process under demagnification by using a mirror which is formed by multi-coating materials having different refractive indexes. Further, a transmission type and a reflection type are known as the type of the mask. The above-mentioned principles of the phase shift are applicable to both types in the same manner.

The optimum phase difference of the phase-shifting masks as described above is 180 degrees on principle, and the exposure characteristic is deteriorated if there is a phase error (a deviation from 180 degrees in phase difference). It is known that the phase error has the most remarkable effect on the focus characteristic (the relationship between the focus position and the pattern dimension) and the focus characteristic is inclined by the phase error. In general, the permissible range of the phase error is set within ±5 degrees.

Further, a phase difference measuring machine which is exclusively used for phase-shifting masks has been developed in order to accurately manage the phase difference. At present, Phase-1 produced by Mizojiri Optics Company (Japan) and MPM-100/248 produced by Lasertec Corporation (Japan) are introduced into many phase-shifting mask manufacturing lines, and they are used as standard machines. In these measuring machines, light having the same wavelength as the exposure light is used, and one light beam is divided into two light beams to transmit the two light beams through different places on the mask and then make these transmitted light beams interfere with each other, thereby measuring the phase difference between the transmitted light beams at the two places.

However, as indicated by the inventors of this application in Japanese Laid-open Patent Application No. Hei-8-114909, there is a case where it is better to intentionally generate a phase error. Here, when the phase difference is equal to 180 degrees, it may not meet the optimum condition due to the effects of the structure of the semiconductor substrate, the thickness of the photosensitive resin film, the solubility characteristic of the photosensitive resin, the aberration of the projection lens system, etc.

The conventional phase-shifting mask and exposure method as described above have the following problems.

(1) If the setting of the phase difference is displaced in the phase-shifting mask, the focus characteristic would be inclined. Since the phase difference is dependent on the thickness and the refractive index of the transparent film or the semi-transparent film, a phase error occurs due to the following two causes: 1) the variation of the refractive index, and 2) the dispersion of the film thickness. The phase difference cannot be accurately measured unless the transparent film or the semi-transparent film is processed and the phase-shifting mask is finally completed. In general, the film formation by a sputtering method causes variations of the film thickness by several percentages, and thus a phase error of about 5 degrees in phase difference remains. This phase error can be suppressed to a small value by manufacturing a number of masks and selecting from these masks a mask whose phase is nearest to a desired one. However, in this method, the price of the phase-shifting mask is heightened, and thus it is not practically usable.

(2) There is a case where the optimum phase difference is not equal to 180 degrees in a phase-shifting mask, and thus in the prior art it is needed to determine the optimum phase difference on the basis of the result of experiments which are made by actually using the semiconductor substrate, the phase-shifting mask and the exposure system.

(3) In the exposure method, the effect of the spherical aberration is little, and the accurate measurement of the spherical aberration is not performed. Therefore, there is no simple measuring method which can measure the spherical aberration amount of the projection lens system installed in the exposure system.

SUMMARY OF THE INVENTION

An object of the present invention is to provide a phase-shifting mask and an exposure method which can enlarge the depth of focus and enhance the precision of the pattern dimension of semiconductor devices manufactured by using the mask and method, on the basis of flattening the focus characteristics of the phase-shifting mask.

Another object of the present invention is to provide a method of measuring the amount of spherical aberration which can accurately and simply measure the spherical aberration amount of a projection lens system installed in an exposure system.

In order to attain the above objects, according to a first aspect of the present invention, an exposure method in which a phase-shifting mask for generating a predetermined phase difference between transmission light beams through adjacent areas is illuminated by transmission illumination to thereby focus the light beams through a projection lens system, is characterized in that spherical aberration is added to the projection lens system and a phase error corresponding to the added spherical aberration amount is added to the phase difference of the phase-shifting mask.

According to the exposure method of the first aspect of the present invention, the spherical aberration is added to the projection lens system, and the exposure is performed by using the phase-shifting mask which is provided with the phase error corresponding to the spherical aberration amount. Accordingly, the depth of focus can be enlarged by flattening the focus characteristic, and the precision of the pattern dimension of semiconductor devices manufactured by using the exposure method can be enhanced.

According to a second aspect of the present invention, an exposure method in which a phase-shifting mask for generating a predetermined phase difference between transmission light beams through adjacent areas is illuminated by transmission illumination to thereby focus the light beams through a projection lens system, is characterized in that the phase difference of the phase-shifting mask is measured and the spherical aberration amount of the projection lens system is set on the basis of the measurement result.

In the exposure method of the second aspect of the present invention, as a method of setting the spherical aberration, the spherical aberration which is proportional to the phase error of the phase-shifting mask is set.

In the above exposure method, the setting of the spherical aberration is set on the basis of the phase error of the phase-shifting mask being used. Accordingly, even when a phase error occurs in the phase-shifting mask being used, by flattening the focus characteristic, the depth of focus can be enlarged and the precision of the pattern dimension of the semiconductor devices can be enhanced.

According to a third aspect of the present invention, a phase-shifting mask which generates a predetermined phase difference between transmitted light beams through adjacent areas, is characterized in that the phase difference is set on the basis of the spherical aberration amount of an exposure system being used.

According to the phase-shifting mask of the third aspect of the present invention, the setting of the phase difference is performed by adding the phase difference with a phase error which is proportional to the spherical aberration amount.

In the above phase-shifting mask, the phase difference corresponding to the spherical aberration amount of the exposure system being used is set in the phase-shifting mask being used. Accordingly, even when the spherical aberration remains in the exposure system being used, the focus characteristic is flattened to enlarge the depth of focus and thus the precision of the pattern dimension of the semiconductor devices can be enhanced.

According to a fourth aspect of the present invention, a spherical aberration amount measuring method of measuring the amount of spherical aberration of a projection lens system for focusing illumination light transmitted through a phase-shifting mask which generates a predetermined phase difference between transmitted light beams through adjacent areas, is characterized in that a slope of the focus characteristic to variation of the spherical aberration amount is predetermined, and the spherical aberration amount is determined on the basis of the slope.

According to the measuring method of the fourth aspect of the present invention, the slope of the focus characteristic to the variation of the spherical aberration amount in the projection lens system to be measured is predetermined, and the spherical aberration amount is measured by using the slope. Further, the spherical aberration in the case of the phase-shifting mask has a more remarkable effect on the focus characteristic than that in the case of the normal mask, and thus the spherical aberration amount can be accurately measured in the exposure system using the phase-shifting mask.

According to a fifth aspect of the present invention, a spherical aberration amount measuring method of measuring the amount of spherical aberration of a projection lens system for focusing illumination light transmitted through a phase-shifting mask which generates a predetermined phase difference between transmitted light beams through adjacent areas, is characterized in that exposure is performed by using plural phase-shifting masks which are different in phase difference, and the spherical aberration amount is determined on the basis of the phase difference of a phase-shifting mask whose focus characteristic is flat.

According to the spherical aberration amount measuring method of the fifth aspect of the present invention, the exposure is performed by using the plural phase-shifting masks which are different in phase difference, a phase-shifting mask whose focus characteristic is flat is searched, and the spherical aberration amount is determined on the basis of the phase difference thereof.

Accordingly, the spherical aberration amount of the projection lens system can be measured while the projection lens system is not fixed to an exclusively-usable measuring device, but installed in the exposure system, so that the spherical aberration amount can be accurately measured.

The present invention has the following effects.

(1) According to the exposure method of the first aspect of the present invention, the spherical error is added to the exposure system, and the phase error is set in the phase-shifting mask in conformity with the spherical aberration, whereby the focus characteristic is flatter than the prior art (the case where a phase-shifting mask having a phase difference of 180 degrees is merely used) to thereby enlarge the depth of focus and enhance the precision of the pattern dimension of the semiconductor devices.

(2) According to the exposure method of the second aspect of the present invention, even when the phase error occurs in the phase-shifting mask being used, by setting in the exposure device the spherical aberration which is matched to the phase error, the focus characteristic can be flattened to enlarge the depth of focus and enhance the precision of the pattern dimension of the semiconductor devices.

(3) According to the phase-shifting mask of the third aspect of the present invention, when the spherical aberration remains in the exposure system being used, the phase difference is set in conformity with the spherical aberration amount, so that the focus characteristic is flattened to enlarge the depth of focus and enhance the precision of the pattern dimension of the semiconductor devices.

(4) According to the measuring method of the spherical aberration amount of the fourth aspect of the present invention, the spherical aberration is measured on the basis of the slope of the focus characteristic of the phase-shifting mask to the variation of the spherical aberration amount of the exposing system, so that the spherical aberration amount of the exposing system can be measured with high precision.

(5) According to the measuring method of the spherical aberration amount of the fifth aspect of the present invention, the spherical aberration amount of the projection lens system is measured not in the state where it is fixed to the exclusively-used measurement device, but in the state where it is installed in the exposure system, so that the spherical aberration amount of the projection lens system in the state where it is actually used can be accurately measured.

BRIEF DESCRIPTION OF THE DRAWINGS

FIGS. 6A to 6E are graphs showing variation of the focus characteristic of phase-shifting masks having different phase differences due to spherical aberration in an exposure method according to a second embodiment of the present invention;

DETAILED DESCRIPTION OF THE PREFERRED EMBODIMENTS

Preferred embodiments according to the present invention will be described hereunder with reference to the accompanying drawings.

(First Embodiment)

In the exposure method of the first embodiment, a mercury i-line (wavelength $\lambda=365$ nm) exposure system in which the reduction ratio is equal to 5 (mask pattern dimension : pattern dimension on focus (image) plane=5:1), NA=0.6 and coherence factor $\sigma=0.3$ is used as the exposure system.

First, the spherical aberration to be added to the projection lens system to enlarge the depth of focus is set to $0.1\lambda$. The phase-shifting mask being used is the halftone type phase-shifting mask, and the transmittance and the phase difference thereof are set to 8% and 200 degrees. The phase difference is defined as follows. That is, the phase difference is larger as the thickness of the semi-transparent film of halftone increases, and it is set to a negative phase error when the film thickness is smaller than a desired film thickness and to a positive phase error when the film thickness is larger than the desired film thickness. Further, a mask bias is generally needed in the halftone phase-shifting mask. In this embodiment, a bias of 0.05 micron is applied to form a hole pattern of 0.35 micron on the semiconductor substrate, and the mask pattern is set to a 0.4-micron hole pattern (on the mask, it is set to five times, i.e., 2.0 microns).

Figure 1A:
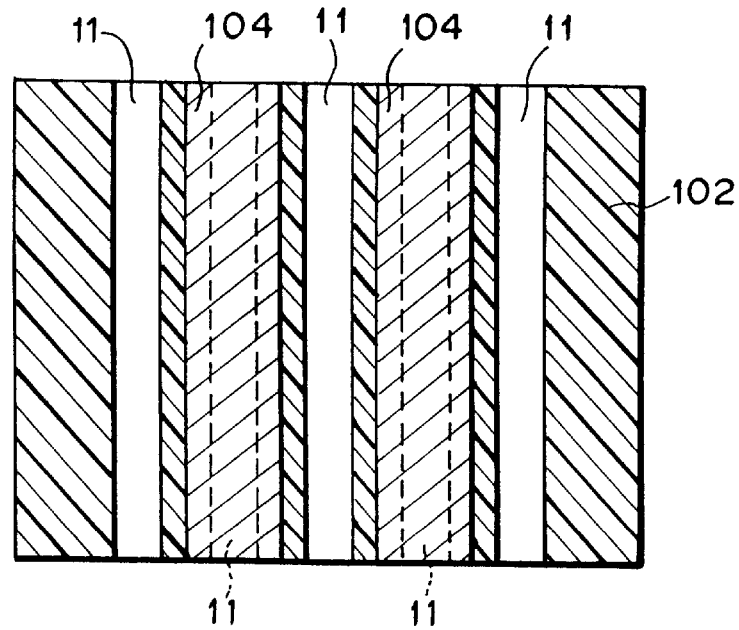
FIGS. 1A and 1B are plan view and longitudinally-sectional view showing a conventional Shibuya-Levenson type phase-shifting mask.
Figure 1B:
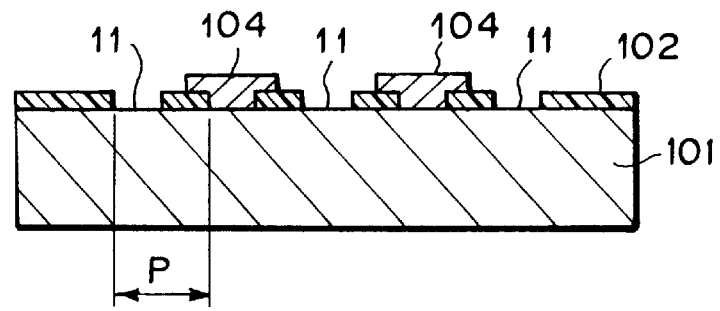
Figure 1C:
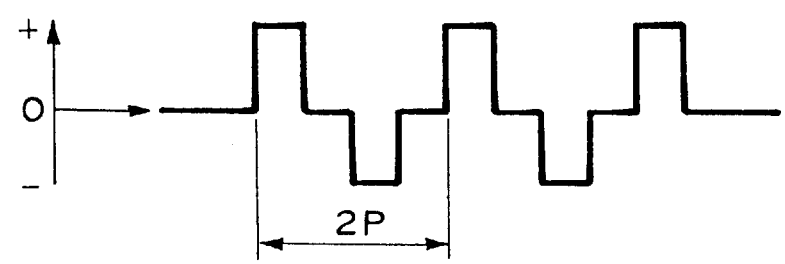
FIG. 1C is a diagram showing the amplitude distribution of transmitted light.
Figure 2A:
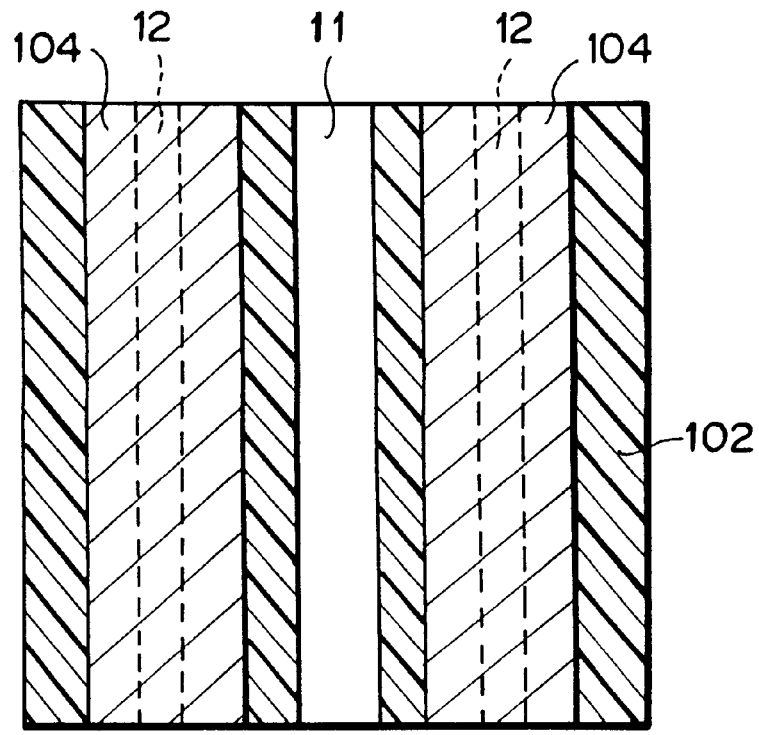
FIGS. 2A and 2B are plan view and longitudinally-sectional view showing a conventional auxiliary pattern type phase-shifting mask.
Figure 2B:
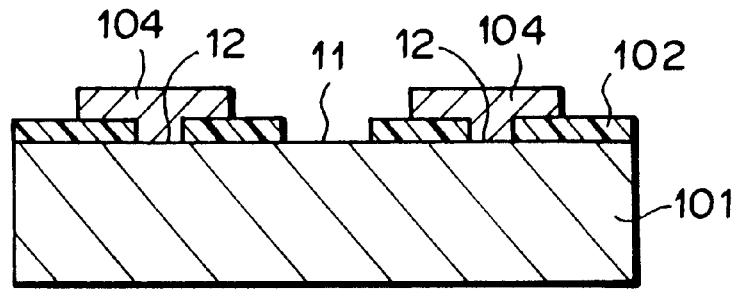
Figure 3A:
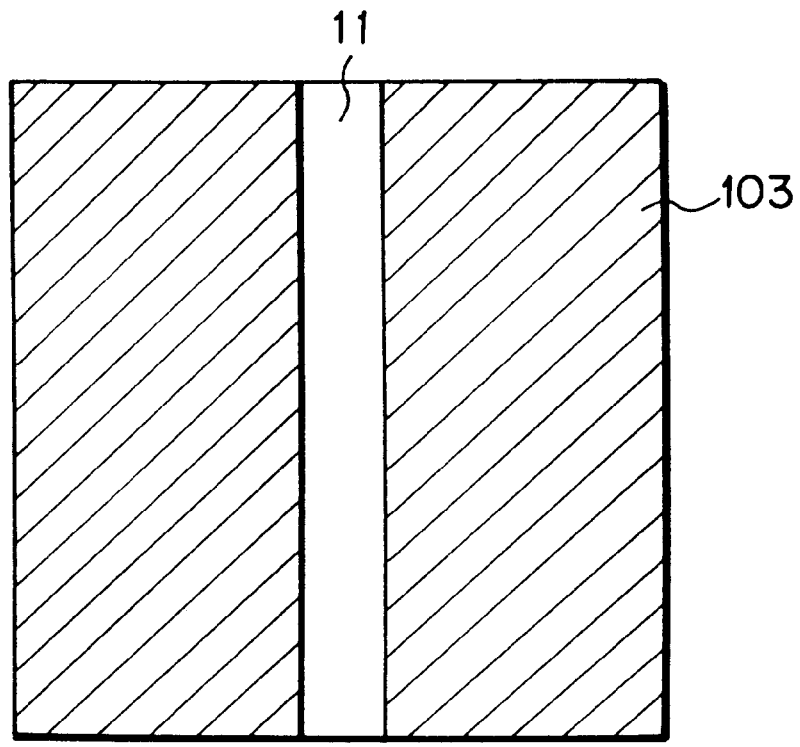
FIGS. 3A and 3B are plan view and longitudinally-sectional views showing a conventional halftone type phase-shifting mask.
Figure 3B:
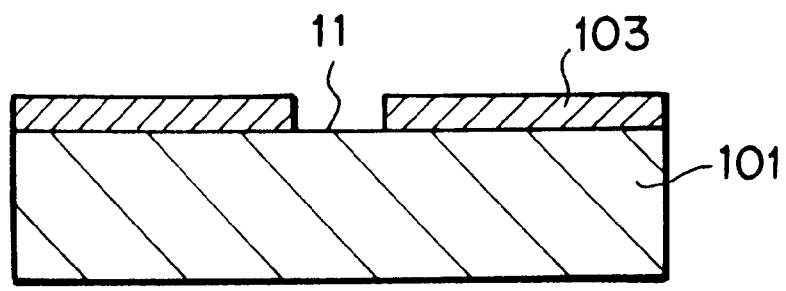
Figure 4:
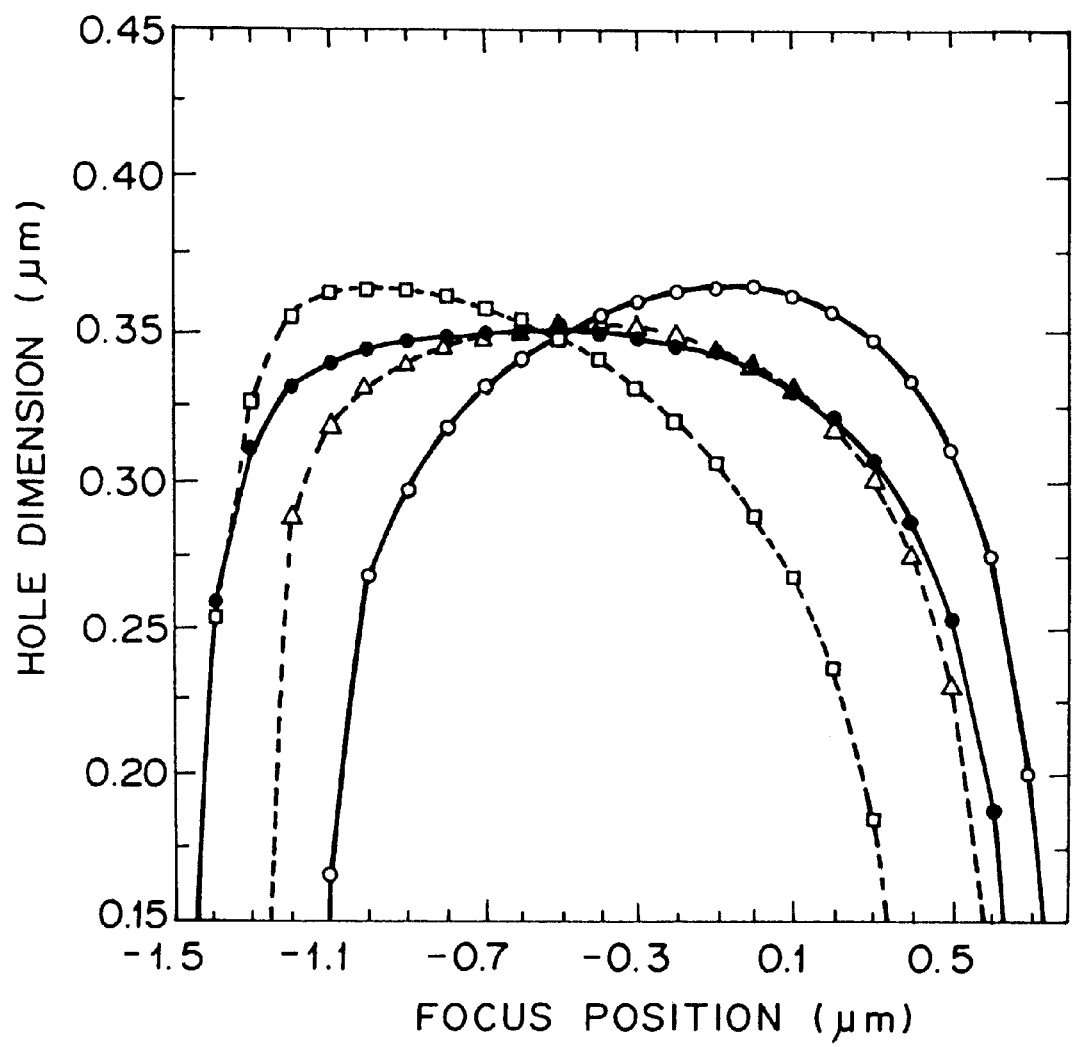
FIG. 4 is a graph showing the focus characteristic of an exposure method according to a first embodiment of the present invention.

FIG. 4 shows a simulation result of the focus characteristic of the 0.35-micron hole pattern which is obtained by the exposure method of this embodiment. A lithographic simulator: Porlith/2 produced by FINLE Technologies, Inc. (U.S.A.) sold in the market is used for the simulation, and as the other conditions, photosensitive resin (resist) is patterned at a thickness of 1 micron on a silicon (Si) substrate.

Further, the definition of the focus position is set as follows. When the focus is established on the surface of the photosensitive resin, the focus position is set to zero micron. The direction in which the focus plane is upwardly moved is set to "+", and the direction in which the focus plane is downwardly moved is set to "−". FIG. 4 also shows the focus characteristic of the conventional exposure method for comparison. In the focus characteristic based on the conventional exposure method (phase difference of 180 degrees, spherical aberration of zero), the depth of focus is equal to −1.1 to 0.2 micron. On the other hand, in the focus characteristic based on the exposure method of this embodiment (phase difference of 200 degrees, spherical aberration of 0.1λ), the depth of focus is equal to −1.3 to 0.2 micron, which shows that the depth of focus is enlarged by 0.2 micron.

Figure 5A:
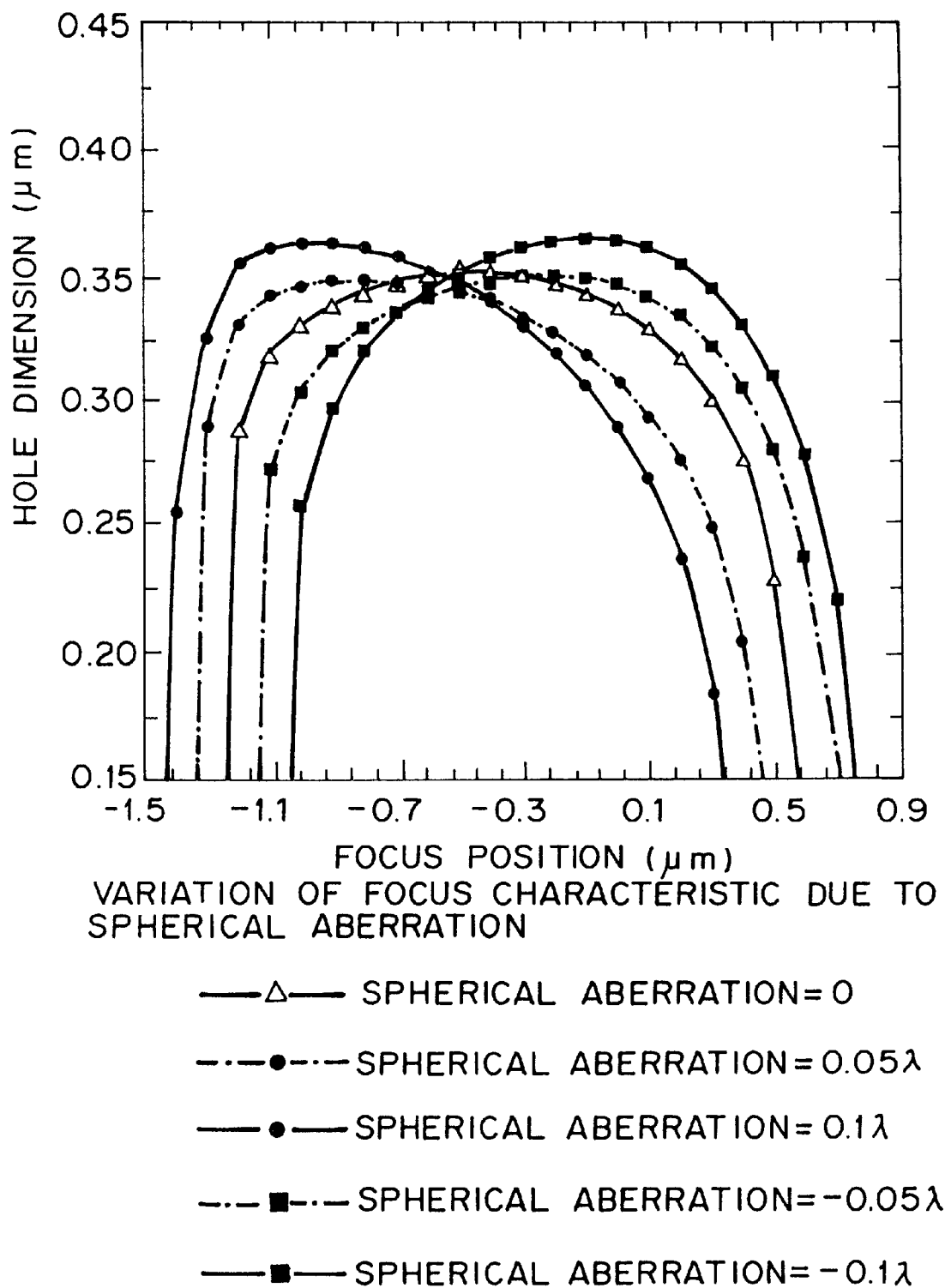
FIG. 5A is a graph showing variation of the focus characteristic of the exposure method of the first embodiment due to spherical aberration.
Figure 5B:
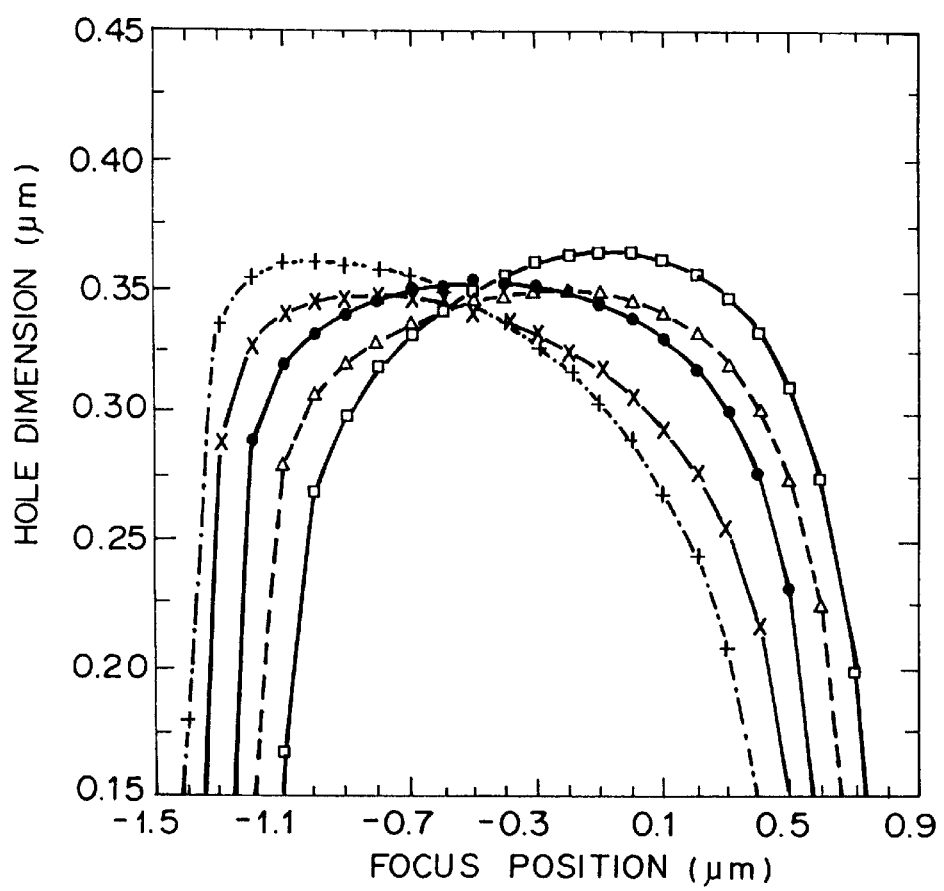
FIG. 5B is a graph showing variation of the focus characteristic due to a phase error.

Next, the principle and the effect of this embodiment will be described in detail. First, the effect of the spherical aberration in the halftone phase-shifting mask will be described. FIGS. 5A and 5B show the simulation result of the focus characteristic of 0.35-micron hole, wherein FIG. 5A shows the variation of the focus characteristic due to spherical aberration at a phase difference of 180 degrees, and FIG. 5B shows the variation of the focus characteristic due to a phase error.

As shown in FIGS. 5A and 5B, the focus characteristic is inclined as the spherical error is added, and the slope direction of the focus characteristic is inverted at the turning point between the positive and negative values of the spherical aberration. Therefore, the method of enlarging the depth of focus by the spherical aberration as in the case of the normal photomask is not directly applicable to the halftone type phase-shifting mask.

Upon comparison between FIGS. 5A and 5B, it is apparent that the effect of the phase error and the effect of the spherical aberration are substantially identical to each other. Therefore, the focus characteristic can be flattened by providing a phase error so that the phase error is inclined in the opposite direction to the effect of the spherical aberration. In FIGS. 5A and 5B, since the spherical aberration of 0.1λ has the same effect on the focus characteristic as the case where there is a phase error of −20 degrees (phase difference of 160 degrees), the flat focus characteristic can be obtained by performing a phase difference correction of +20 degrees. FIG. 4 shows the focus characteristic obtained by the exposure method to which the above method is applied, and the slope of the focus characteristic based on the spherical aberration is corrected by the phase error. Therefore, in this embodiment, the focus characteristic can be flattened to enlarge the depth of focus more remarkably and enhance the precision of the pattern dimension of semiconductor devices manufactured by using the exposure method of this embodiment more greatly as compared with the conventional exposure method.

The exposure method of this embodiment has no restriction on the exposure itself, and thus it is applicable to an exposure process using KrF, X-ray, etc. which have different wavelength. Further, the same is applicable to an exposure system having an optical system of reflection type using no exposure projection lens.

(Second Embodiment)

Next, an exposure method of a second embodiment according to the present invention will be described. In this embodiment, the exposure condition is the same as the first embodiment unless otherwise specified.

Figure 6E:
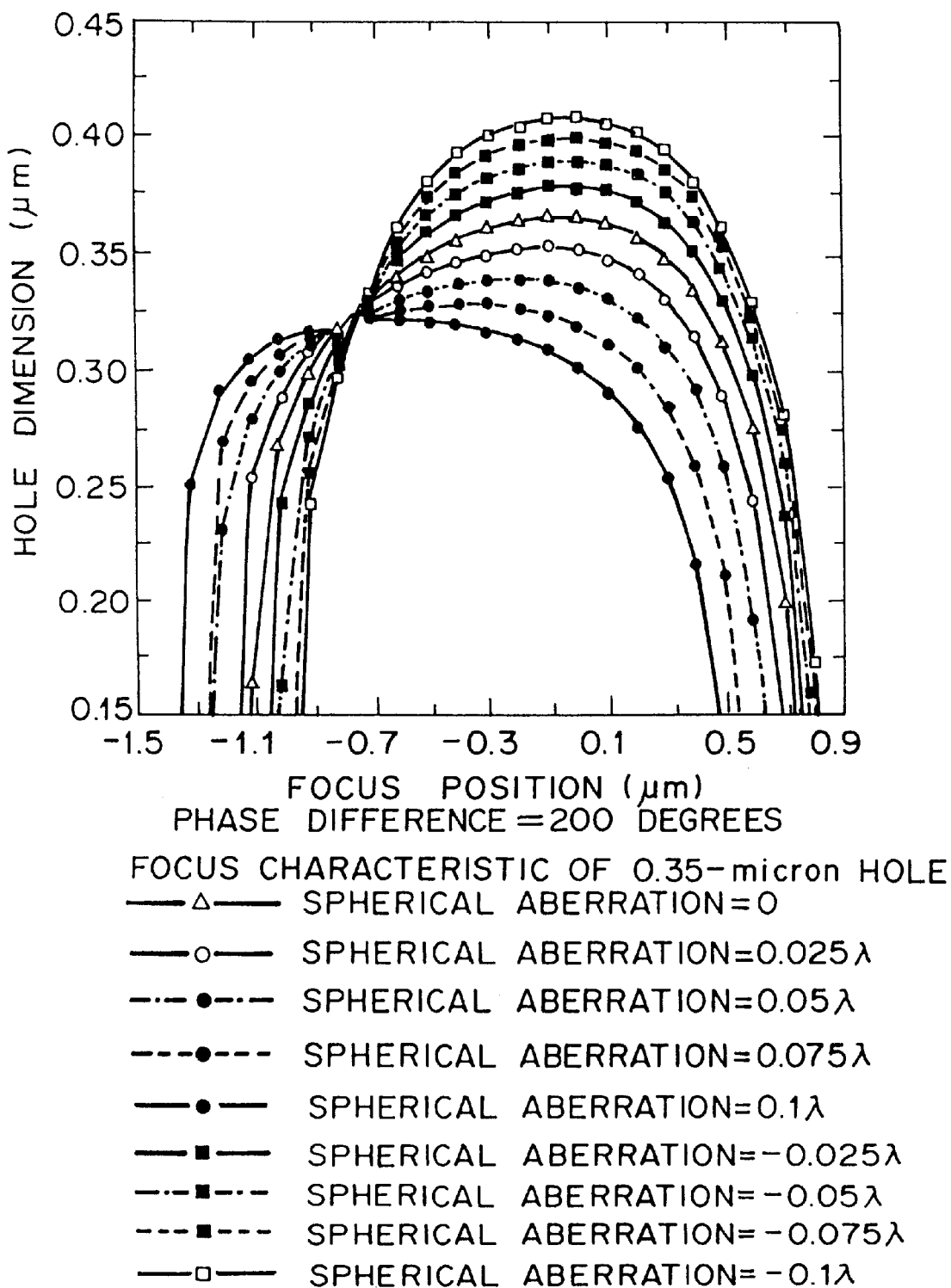

This embodiment is directed to a case where a phase error occurs in a phase-shifting mask due to a mask manufacturing error. In this embodiment, the relationship between the phase error of the phase-shifting mask and the spherical aberration of the projection lens is determined in advance. FIGS. 6A to 6E show the focus characteristics of phase-shifting masks having respective phase errors with the spherical aberration as a parameter. FIG. 6A shows a case at a phase difference of 160 degrees, FIG. 6B shows a case at a phase difference of 170 degrees, FIG. 6C shows a case at a phase difference of 180 degrees, FIG. 6D shows a case at a phase difference of 190 degrees, and FIG. 6E shows a case at a phase difference of 200 degrees.

It is apparent from FIGS. 6A to 6E that the focus characteristic is flat by applying spherical aberration of −0.1λ at −20 degrees of the phase error, −0.05 at −10 degrees, +0.05λ at +10 degrees and +0.1λ at +20 degrees. Therefore, in the range of the phase error, the phase error $\Delta\theta_1$ and the spherical aberration amount $\Delta S_1(\lambda)$ for improving the focus characteristic satisfies the following equation:

$$\Delta S_1(\lambda) = 0.005 \times \Delta\theta_1 \tag{1}$$

Accordingly, when the phase-shifting mask is used on a semiconductor manufacturing line, the data of the phase error is managed in each mask and the spherical aberration which is given by the above equation is set in the exposure system when the mask is used. By managing the data of the phase error of the phase-shifting mask on the semiconductor manufacturing line as described above, the focus characteristic is improved and thus flattened, so that the depth of focus is increased and thus the precision of the pattern dimension of the semiconductor device can be enhanced.

The coefficient of the relational equation is equal to 0.005 under the exposure condition of this embodiment, however, this value is dependent on the conditions (NA, σ, λ) of the exposure system and the mask (pattern dimension, pattern layout, transmittance). Further, the proportional relationship of the phase error is broken in a great range in accordance with the condition, and it must be confirmed under an actual condition.

The above description is made on the i-line exposure. However, the exposure method of the present invention has no restriction on the exposure, and it is also applicable to a reflection type exposure system using no projection lens.

Further, the exposure method may be applicable to another type phase-shifting mask such as an auxiliary pattern type phase-shifting mask, rim type phase-shifting mask or the like. In the Levenson type, the spherical aberration has a stronger effect to shift the focus position than to incline the focus characteristic. Under the above condition, it is satisfied that the focus position shift=−1×(spherical aberration amount). By this effect, the spherical aberration is added so as to deal with steps formed on the semiconductor substrate, so that the exposure can be performed to match the focus position to the upper and lower sides of the step.

(Third Embodiment)

Next, the phase-shifting mask according to this embodiment will be described. The same exposure condition as the first embodiment is applied unless otherwise specified.

The phase-shifting mask of this embodiment is to obtain a wide depth of focus in an exposure system in which the residual spherical aberration exists. In this case, it is assumed that spherical aberration of +0.05λ exists in the projection lens system of the exposure system.

Figure 7A:
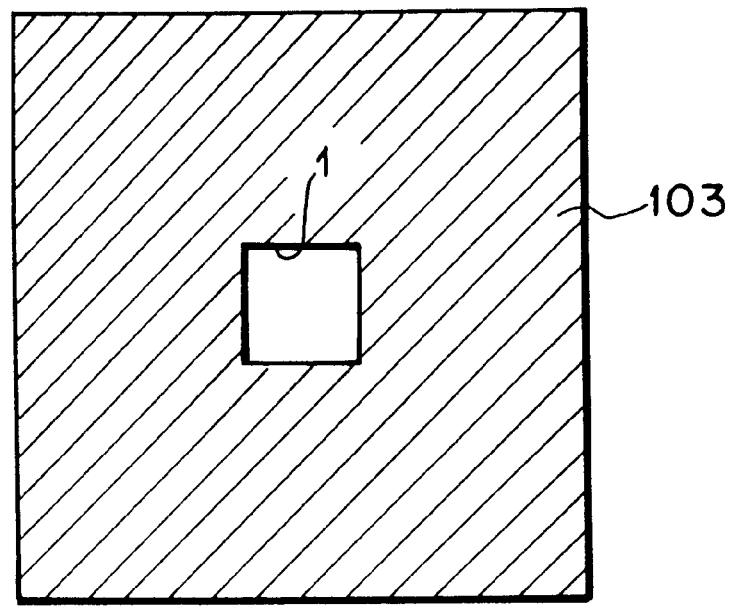
FIG. 7A is a plan view showing a phase-shifting mask according to a third embodiment of the present invention.
Figure 7B:
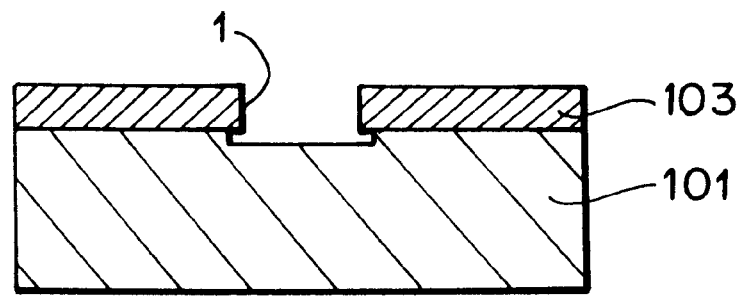
FIG. 7B is a longitudinally-sectional view showing the phase-shifting mask of the third embodiment of the present invention.

FIGS. 7A and 7B are plan view and longitudinally-sectional view showing the phase-shifting mask of this embodiment. The same hole pattern 1 of 2 μm (0.4 μm on the image plane) as described above is used as the mask pattern. As shown in FIG. 7B, the mask structure is as follows. A semi-transparent film 103 of chromium oxide nitride (CrON) is formed on a transparent substrate 101 of synthetic quartz. The film forming condition of the semi-transparent film 103 is the same as the prior art, and the transmittance and the phase difference are set to 8% and 180 degrees, respectively. The transparent substrate 101 of the portion at which the hole pattern 1 is formed is etched at a depth of 21 nm. The etched step of the transparent substrate 101 generates a phase difference of 10 degrees, and the phase difference of the halftone phase-shifting mask is set to 190 degrees by combining the phase difference of 10 degrees based on the etched step and the phase difference of the semi-transparent film 103.

Figure 8A:
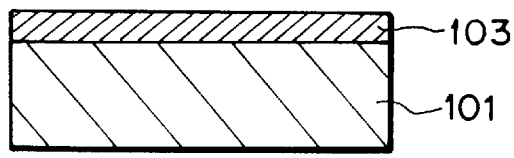
FIGS. 8A to 8E are longitudinally-sectional views showing a manufacturing process of the phase-shifting mask shown in FIGS. 7A and 7B.
Figure 8B:
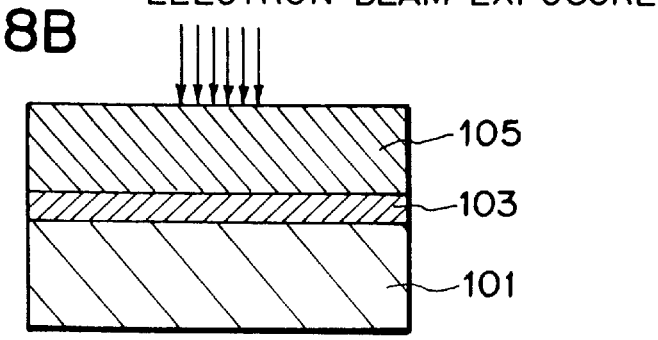
Figure 8C:
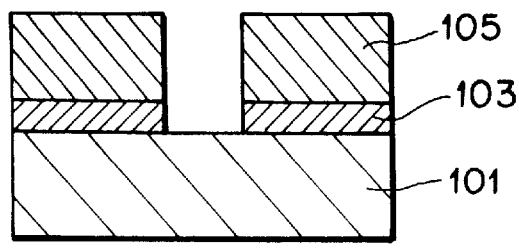
Figure 8D:
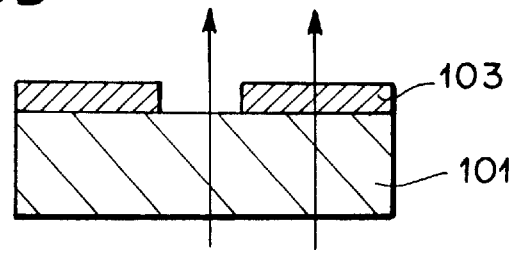
Figure 8E:
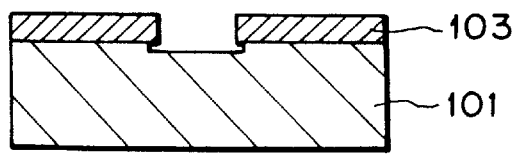

Next, a method of manufacturing the phase-shifting mask of this embodiment will be described. FIGS. 8A to 8E show a main process of manufacturing the phase-shifting mask. As shown in FIG. 8A, the semi-transparent film 103 of chromium oxide nitride is formed on the transparent substrate 101 by a sputtering method under the same condition as the prior art. Subsequently, as shown in FIG. 8B, the photosensitive resin 105 is coated and a pattern is drawn by an electron beam exposure system. Subsequently, as shown in FIG. 8C, the semi-transparent film 103 is etched by the RIE dry etching treatment using chroline gas and oxygen gas as in the case of the prior art. Subsequently, as shown in FIG. 8D, the photosensitive resin 105 is exfoliated, and the phase difference is measured by using MPM-100. In general, a dispersion of about ±5 degrees occurs in the phase difference of the semi-transparent film 103, however, in this case the description is made on the assumption that the phase difference measurement result is equal to 180 degrees. Subsequently, as shown in FIG. 8E, the transparent substrate 101 is etched at a depth of 21 nm at a portion at which the hole pattern 1 is formed. This etching is performed by etching only the transparent substrate 101 with no damage on the semi-transparent film 103 by using diluted hydrofluoric acid (liquid obtained by diluting 130BHF with pure water at a dilution rate of ten or more). Finally, the measurement of the phase difference is performed by MPM-100 again to confirm that the phase difference is equal to 190 degrees.

Actually, the wet etching amount of the transparent substrate 101 is corrected by the result of the phase difference measurement of the semi-transparent film. Assuming that the phase difference measurement result is represented by $\theta_1$ and the phase difference to be finally matched is set to $\theta_2$, the etching depth d is represented as follows:

$$d = (\theta_2 - \theta_1) \lambda / 360(n-1)$$

here, $\theta$ represents the wavelength of exposure light, and n represents the refractive index of the transparent substrate to the exposure light. In this case, d is equal to 2 nm because $\theta_2$ is equal to 190 degrees, $\lambda$ is equal to 365 nm, n is equal to 1.48 and $\theta_1$ is equal to 180 degrees. Therefore, if the phase differences $\theta_1$ of the semi-transparent film 103 is smaller than 180 degrees, the transparent substrate 101 is etched more deeply by the amount corresponding to the decrement of the phase difference to set the phase difference to $\theta_2$. Further, the target phase difference $\theta_2$ is set on the basis of the spherical aberration amount of the exposure system being used as described below.

Figure 9:
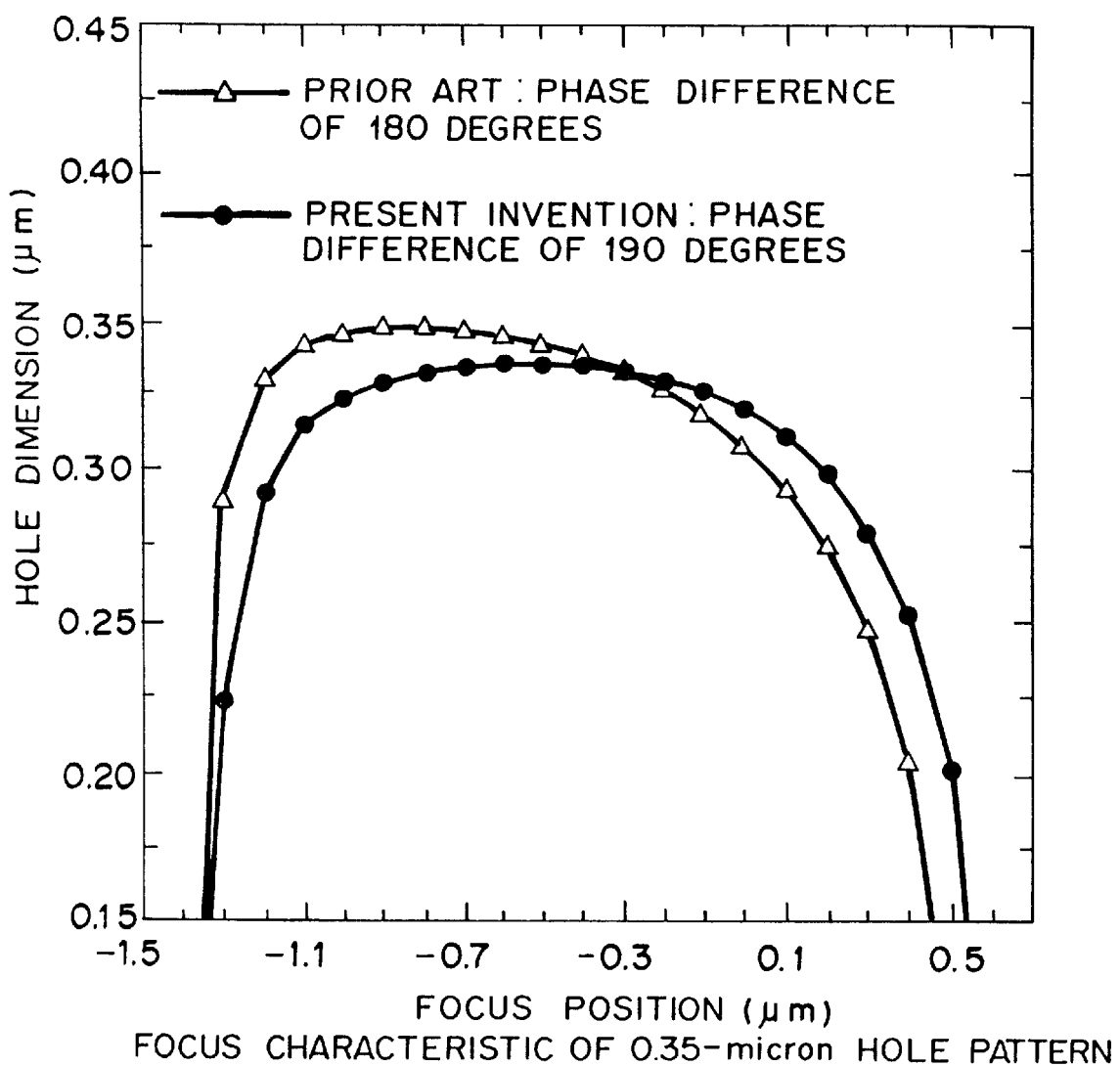
FIG. 9 is a graph showing the focus characteristic of the phase-shifting mask shown in FIGS. 7A and 7B.

Next, the effect of the phase-shifting mask of this embodiment will be described. FIG. 9 shows the focus characteristic of the 0.35-micron hole pattern which is obtained by the phase-shifting mask of this embodiment. In FIG. 9, the focus characteristic of the conventional phase-shifting mask having the phase difference of 180 degrees is shown for the comparison purpose. In the phase-shifting mask of this embodiment, the focus characteristic is flatter as compared with the conventional phase-shifting mask, and the precision of the pattern dimension of the semiconductor devices manufactured by using the phase-shifting mask of this embodiment can be enhanced.

The spherical aberration remains in the exposure system because the lens adjustment when it is installed in the exposure system is insufficient, and this becomes problematic in the exposure process with the phase-shifting mask. This is because the adjustment of the lens when installed in the exposure system is performed on the standard conditions (NA, σ) of the maker of the exposure system. In general, the phase-shifting mask is used under the exposure conditions of lower NA, lower σ than the normal mask, however, the value of the spherical aberration is varied when the illumination condition and the NA value are varied. When the illumination condition and the NA value are varied, the optical path of mask-transmitted light through the projection lens is varied. Since the spherical aberration mainly occurs due to the lens manufacturing error, the spherical aberration amount is also varied if the portion of the lens through which light passes is varied.

Therefore, in the phase-shifting mask of this embodiment, the phase error is uniquely set for each exposure system in conformity with the residual spherical aberration amount. In this case, the relationship between the residual spherical aberration amount $\Delta S_2$ ($\lambda$) and the correcting phase error $\Delta \theta_2$ is represented as follows on the basis of the above relational equation (1):

$$\Delta \theta_2 = 200 \times \Delta S_2(\lambda) \tag{2}$$

The phase error $\Delta \theta_2$ is added to the target phase difference $\theta_2$, and thus the target phase difference $\theta_2 = (180 + \Delta \theta_2)$ degrees.

In this embodiment, the flat focus characteristic is obtained even in the exposure system in which the spherical aberration remains, and thus the depth of focus can be enlarged, so that the precision of the pattern dimension of the semiconductor devices can be enhanced.

The relationship between $\Delta \theta_2$ and $\Delta S_2$ is varied in accordance with the exposure condition, and when conditions other than the above condition are applied, a relational equation such as the equation (2) is predetermined under the conditions.

As in the case of the first and second embodiments, the phase-shifting mask of this embodiment is applicable with no restriction on the exposure light and the exposing system.

Further, this embodiment is also applicable to the auxiliary pattern type phase-shifting mask, the rim type phase-shifting mask and other types phase-shifting masks.

(Fourth Embodiment)

Next, the measuring method of the spherical aberration amount of this embodiment will be described. Another photomask will be described. In this case, a mercury i-line exposure system in which the reduction ratio =5, NA=0.6 and σ=0.3 is used.

Figure 10:
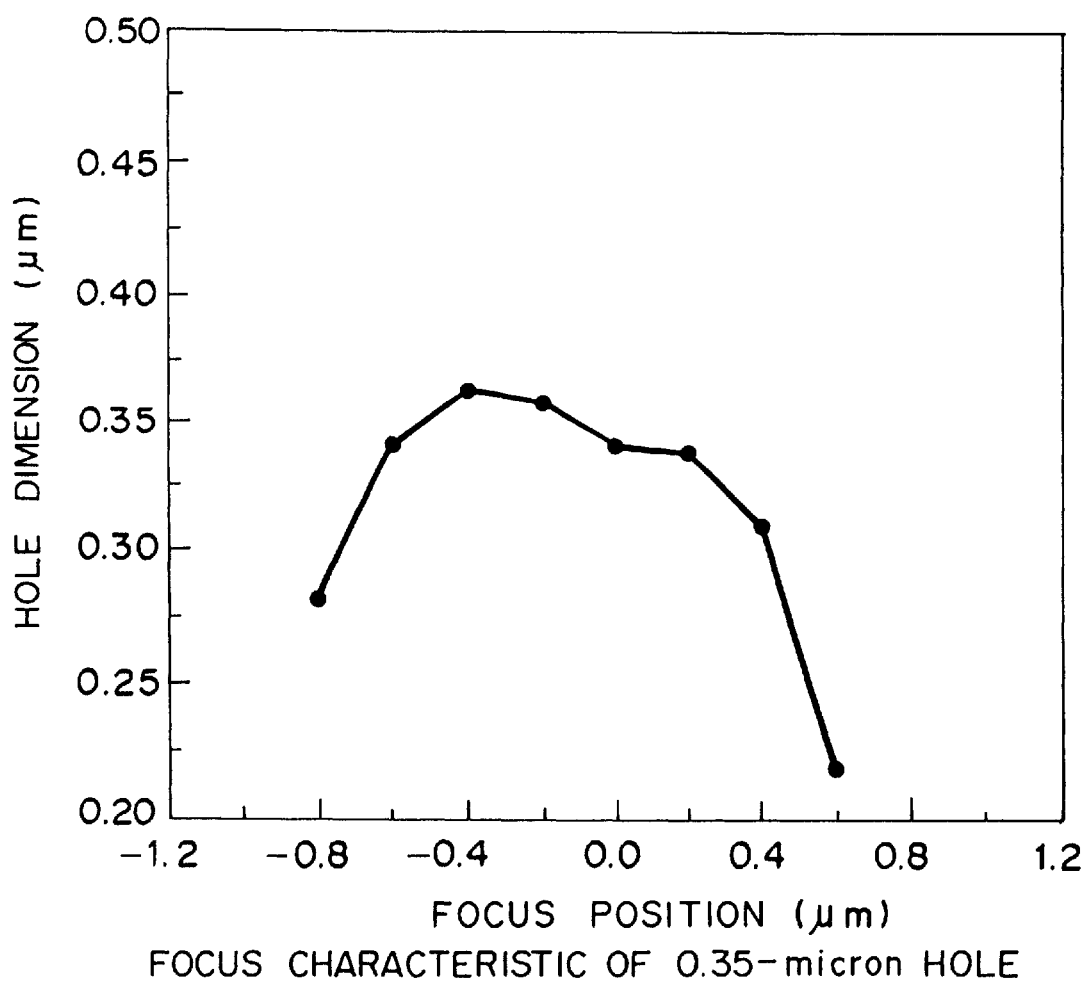
FIG. 10 is a graph showing the focus characteristic of a 0.35 micron hole pattern which is exposed by an exposure system using a spherical aberration amount measuring method of a fourth embodiment of the present invention.

First, the exposure characteristic is measured by using the halftone phase-shifting mask in which the phase difference and the transmittance have been accurately measured. For example, a halftone mask having a transmittance of 8% and a phase difference of 185 degrees is used and a mask bias of 0.05 micron is applied to form a hole pattern of 0.35 micron. FIG. 10 shows the focus characteristic thus obtained. Linear approximation in the vicinity of the defocus =0 micron provides a slope of −0.034.

Subsequently, a simulation is performed under this condition to obtain the focus characteristic. The simulation is performed while varying the spherical aberration amount. Further, there is determined such a spherical aberration amount that the slope of the focus characteristic at the center of the pattern resolution is identical to the result of the exposure system as described above.

Figure 11:
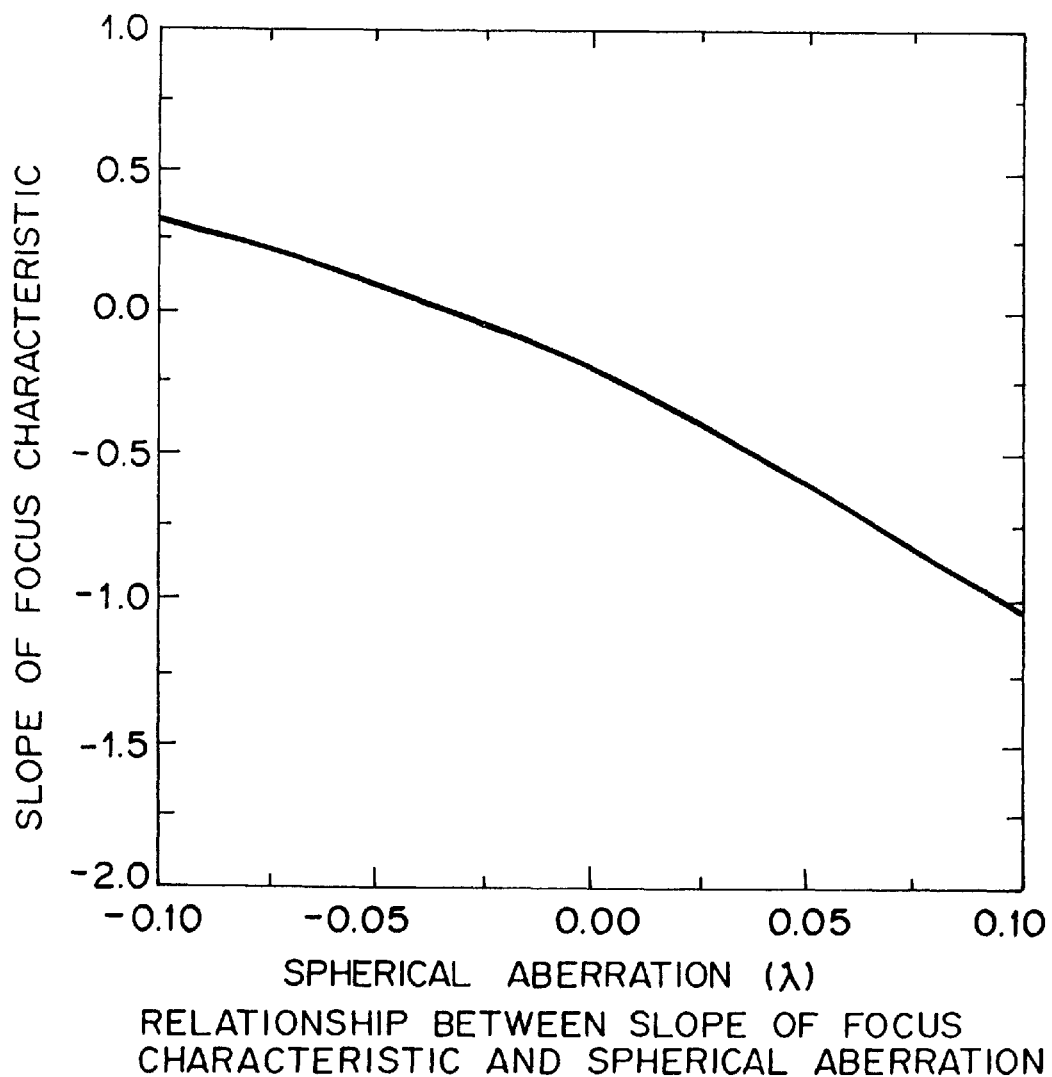
FIG. 11 is a graph showing the relationship between the spherical aberration amount and the slope of the focus characteristic.

FIG. 11 shows the relationship between the spherical aberration amount and the slope of the focus characteristic at the phase difference of 185 degrees. In FIG. 11, when the spherical aberration amount corresponding to the slope of −0.034 is calculated, the residual spherical aberration amount of the exposure system of this embodiment is calculated as 0.0175λ.

In place of the simulation, an experiment may be made by using an exposure system which can change the spherical aberration amount, thereby measuring the focus characteristic of the above-described halftone phase-shifting mask which corresponds to each spherical aberration amount.

Figure 12:
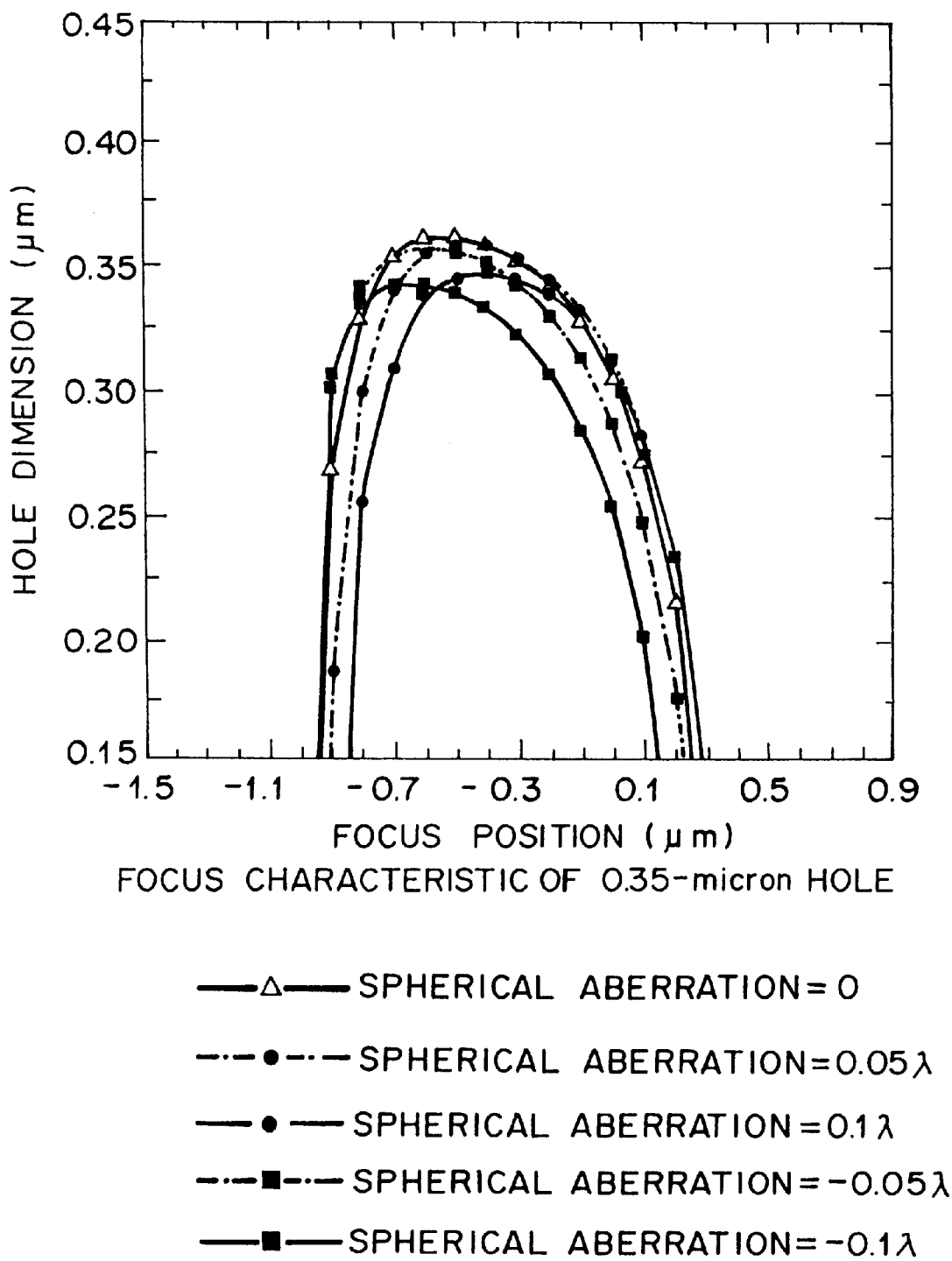
FIG. 12 is a graph showing variation of the focus characteristic due to spherical aberration in a conventional mask.

FIG. 12 shows the focus characteristic of the normal mask for the comparison purpose. FIG. 12 also shows the focus characteristic of the 0.35-micron hole pattern when the spherical aberration is varied. When the spherical aberration is equal to about 0.1λ, the variation of the focus characteristic is slight in the case of the normal mask, and thus it is impossible to estimate the spherical aberration on the basis of the variation.

In the method of measuring the spherical aberration amount according to this embodiment, the spherical aberration amount of the exposure system is calculated on the basis of the slope of the focus characteristic when the phase-shifting mask is used, and thus the measurement can be simply performed on even the exposure system which is installed on a semiconductor device manufacturing line.

The foregoing description is made on the mercury i-line exposure system, however, this embodiment is applicable to exposure light having any wavelength (for example, KrF excimer laser, X-ray, etc.). Further, in addition to the halftone phase-shifting mask, for example, other type phase-shifting masks such as the auxiliary pattern type phase-shifting mask, etc. may be used. Still further, patterns other than the hole pattern may be applied as an estimation pattern. As the pattern dimension is nearer to the resolution limit of the exposure system, the effect of the spherical aberration is more remarkable to enhance the measurement precision. However, as the pattern dimension is excessively small, the resolution can be performed in only a slight range containing the focus position, and thus the slope of the focus characteristic cannot be measured. Therefore, it is preferable that the pattern dimension is set to such a value that some degree of depth of focus can be obtained.

What is claimed is:

1. An exposure method in which a phase-shifting mask for generating a predetermined phase difference between transmission light beams through adjacent areas is illuminated by transmitted illumination to thereby focus light beams through a projection lens system, characterized in that spherical aberration is added to the projection lens system and a phase error corresponding to an amount of the added spherical aberration is added to the phase difference to be generated by the phase-shifting mask.

2. An exposure method in which a phase-shifting mask for generating a predetermined phase difference between transmission light beams through adjacent areas is illuminated by transmitted illumination to thereby focus light beams through a projection lens system, characterized in that the phase difference of the phase-shifting mask is measured and spherical aberration of the projection lens system is set on the basis of an amount of the measured phase difference.

3. The exposure method as claimed in claim 2, wherein the spherical aberration is set in proportion to a phase error of the phase-shifting mask.

4. A phase-shifting mask which generates a predetermined phase difference between transmitted light beams through adjacent areas, characterized in that the phase difference is set on the basis of an amount of the spherical aberration of an exposure system in which the phase-shifting mask is installed.

5. The phase-shifting mask as claimed in claim 4, wherein the phase difference is set by adding to the phase difference a phase error which is proportional to the amount of the spherical aberration of an exposure system.

6. A spherical aberration amount measuring method of measuring an amount of spherical aberration of a projection lens system for focusing illumination light transmitted through a phase-shifting mask which generates a predetermined phase difference between transmitted light beams through adjacent areas, characterized in that a slope of focus characteristic to variation of the spherical aberration is predetermined, and the amount of the spherical aberration is determined on the basis of the slope.

7. A spherical aberration amount measuring method of measuring an amount of spherical aberration of a projection lens system for focusing illumination light transmitted through a phase-shifting mask which generates a predetermined phase difference between transmitted light beams through adjacent areas, characterized in that exposure is performed by using plural phase-shifting masks which generate different phase difference from each other, and the amount of the spherical aberration is determined on the basis of an amount of the phase difference of the phase-shifting mask on which a flatness of focus characteristic is obtained.

* * * * *